(12) United States Patent
Lin (10) Patent No.: US 7,879,653 B2
(45) Date of Patent: Feb. 1, 2011

(54) LEADLESS SEMICONDUCTOR PACKAGE WITH ELECTROPLATED LAYER EMBEDDED IN ENCAPSULANT AND THE METHOD FOR MANUFACTURING THE SAME

(75) Inventor: Hung-Tsun Lin, Tainan (TW)

(73) Assignees: Chipmos Technologies (Bermuda) Ltd., Hamilton (BM); Chipmos Technologies Inc., Hsinchu (TW)

( * ) Notice: Subject to any disclaimer, the term of this patent is extended or adjusted under 35 U.S.C. 154(b) by 69 days.

(21) Appl. No.: 12/189,165

(22) Filed: Aug. 10, 2008

(65) Prior Publication Data

US 2010/0178734 A1 Jul. 15, 2010

Related U.S. Application Data

(62) Division of application No. 11/580,309, filed on Oct. 13, 2006, now abandoned.

(30) Foreign Application Priority Data

Mar. 24, 2006 (CN) .................................. 95110296

(51) Int. Cl.
*H01L 21/60* (2006.01)
(52) U.S. Cl. ....................... 438/123; 257/673; 257/690; 257/E23.031; 257/E23.061; 257/E21.506; 438/111; 438/124
(58) Field of Classification Search ................. 257/673, 257/690, E23.031, E23.061, E21.506; 438/111, 438/123, 124
See application file for complete search history.

(56) References Cited

U.S. PATENT DOCUMENTS

| | | | | |
|---|---|---|---|---|
| 6,229,200 B1 * | 5/2001 | Mclellan et al. | ............. | 257/666 |
| 6,638,790 B2 * | 10/2003 | Minamio et al. | ............ | 438/111 |
| 6,677,663 B1 * | 1/2004 | Ku et al. | ...................... | 257/666 |
| 6,933,594 B2 * | 8/2005 | McLellan et al. | ........... | 257/676 |
| 6,964,918 B1 * | 11/2005 | Fan et al. | ..................... | 438/614 |
| 7,049,177 B1 * | 5/2006 | Fan et al. | ..................... | 438/123 |
| 7,348,659 B2 * | 3/2008 | Amano et al. | ............... | 257/666 |
| 7,563,648 B2 * | 7/2009 | Islam et al. | .................. | 438/124 |
| 2003/0003627 A1 * | 1/2003 | Yamaguchi et al. | ......... | 438/123 |
| 2003/0045032 A1 * | 3/2003 | Abe | .......................... | 438/123 |
| 2004/0070056 A1 * | 4/2004 | Matsuzawa et al. | ......... | 257/666 |
| 2004/0080025 A1 * | 4/2004 | Kasahara et al. | ............ | 257/666 |
| 2006/0105501 A1 * | 5/2006 | Kuah et al. | ................. | 438/123 |

* cited by examiner

*Primary Examiner*—Eugene Lee
*Assistant Examiner*—Peniel M Gumedzoe (57) ABSTRACT

A leadless semiconductor package with an electroplated layer embedded in an encapsulant and its manufacturing processes are disclosed. The package primarily includes a half-etched leadframe, a chip, an encapsulant, and an electroplated layer. The half-etched leadframe has a plurality of leads and a plurality of outer pads integrally connected to the leads. The encapsulant encapsulates the chip and the leads and has a plurality of cavities reaching to the outer pads to form an electroplated layer on the outer pads and embedded in the cavities. Accordingly, under the advantages of lower cost and higher thermal dissipation, the conventional substrates and their solder masks for BGA (Ball Grid Array) or LGA (Land Grid Array) packages can be replaced. The leads encapsulated in the encapsulant have a better bonding strength and the electroplated layer embedded in the encapsulant will not be damaged during shipping, handling, or storing the semiconductor packages. Furthermore, the manufacturing processes include two half-etching steps to form the half-etched leadframe where a second half-etching step is performed after forming the encapsulant and before forming the electroplated layer.

10 Claims, 10 Drawing Sheets

LEADLESS SEMICONDUCTOR PACKAGE WITH ELECTROPLATED LAYER EMBEDDED IN ENCAPSULANT AND THE METHOD FOR MANUFACTURING THE SAME

RELATED APPLICATIONS

This application is a Division of currently application U.S. Ser. No. 11/580,309, entitled "LEADLESS SEMICONDUCTOR PACKAGE WITH ELECTROPLATED LAYER EMBEDDED IN ENCAPSULANT AND THE METHOD FOR MANUFACTURING THE SAME" and filed on Oct. 13, 2006 now abandoned.

FIELD OF THE INVENTION

The present invention relates to a leadless semiconductor package, and more particularly, to a leadless semiconductor package with electroplated layer(s) embedded in an encapsulant and its manufacturing processes.

BACKGROUND OF THE INVENTION

Leadless semiconductor packages such as Quad Flat Nonleaded, QFN, or Thin Small Outline Nonleaded, TSON, are IC packages with lower cost, higher thermal conductivity and smaller footprint. When using leadless leadframes as chip carriers for leadless semiconductor packages, the bottom surfaces of the inner leads are used as external terminals. There is no need for outer leads extending from the sides of the encapsulant so that the dimension of the semiconductor package can further be shrunk. Such a leadless semiconductor package is disclosed in U.S. Pat. No. 6,143,981.

However, the materials of leadframes are normally etchable metals for easy leadframe formation such as copper, iron, or their alloys, which are easily suffered from corrosions. Therefore, an electroplated layer is plated on the exposed surfaces of the inner leads such as nickel/gold, tin, or solder to prevent corrosions and to enhance soldering adhesion to external printed circuit boards. The manufacturing processes of a leadless semiconductor package normally include "die attaching", "electrically connecting", "encapsulating", "electroplating", and "singulation" in turn. An electroplating step is performed after encapsulation, the electroplated layer is disposed on the bottom surface of the inner leads and is protruded from the bottom of the encapsulant. The related packaging processes have been disclosed in Taiwan Patent No. 1244745, "A leadless leadframe for manufacturing a leadless package and its processes".

According to conventional processes, the electroplated layer for external terminals is protruded from the bottom surface of the encapsulant. However, the electroplated layers of the leadless semiconductor packages can easily be damaged during the shipping, handling, or storage. Moreover, since there is no solder mask on the inner leads, the electroplated layer can easily be plated on the peripheries of the inner leads leading to electrical shorts.

Furthermore, another issue of the conventional leadless semiconductor packages is most of the bottom surfaces and sides of the inner leads of a leadframe are exposed from the bottom surface of the encapsulant, there is not enough adhesion between the leadframe and the encapsulant. The inner leads will easily separate from the bottom surface of the encapsulant due to the induced thermal cycles during chip operations.

SUMMARY OF THE INVENTION

The main purpose of the present invention is to provide a leadless semiconductor package and it manufacturing processes. The provided leadless leadframe has a plurality of leads and a plurality of outer pads integrally connected to the leads where an encapsulant encapsulates the chip and the leads including the bottom surfaces of the leads. The encapsulant has a plurality of cavities reaching to the outer pads to accommodate the electroplated layers to replace the conventional solder masks, to prevent the damages of the electroplated layer during shipping, handling, and storage, and to enhance the adhesion between the leads and the encapsulant without sacrificing the benefits of lower cost and higher thermal conductivity.

The second purpose of the present invention is to provide a leadless semiconductor package and its manufacturing processes where the diameters of the cavities in the encapsulant are smaller than the outer pads of the leadframe to define the exposed area of the outer pads, to eliminate the solder masks, and to enhance the adhesions between the outer pads and the encapsulant.

The third purpose of the present invention is to provide a manufacturing process for leadless semiconductor package where there are two etching steps, one before the die attachment and the other one after encapsulation, so that the second electroplating can be performed on t the outer pads which are exposed from the cavities of the encapsulant to prevent damages of the electroplated layer and the inner leads are embedded in the encapsulant to enhance the adhesion of the leads.

A leadless semiconductor package according to the present invention comprises a half-etched leadframe, a chip, an encapsulant, and an electroplated layer where the half-etched leadframe has a plurality of leads and a plurality of outer pads integrally connected to the leads. The chip is disposed on the half-etched leadframe and electrically connected to the leads. The encapsulant encapsulates the chip and the leads where the encapsulant has a plurality of cavities reaching to the outer pads. The electroplated layer is formed on the outer pads and embedded in the cavities to prevent damages during shipping, handling, and storage and to enhance the adhesion between the leads and the encapsulant.

DETAIL DESCRIPTION OF THE INVENTION

Please refer to the attached drawings, the present invention will be described by means of embodiment(s) below.

Figure 1:
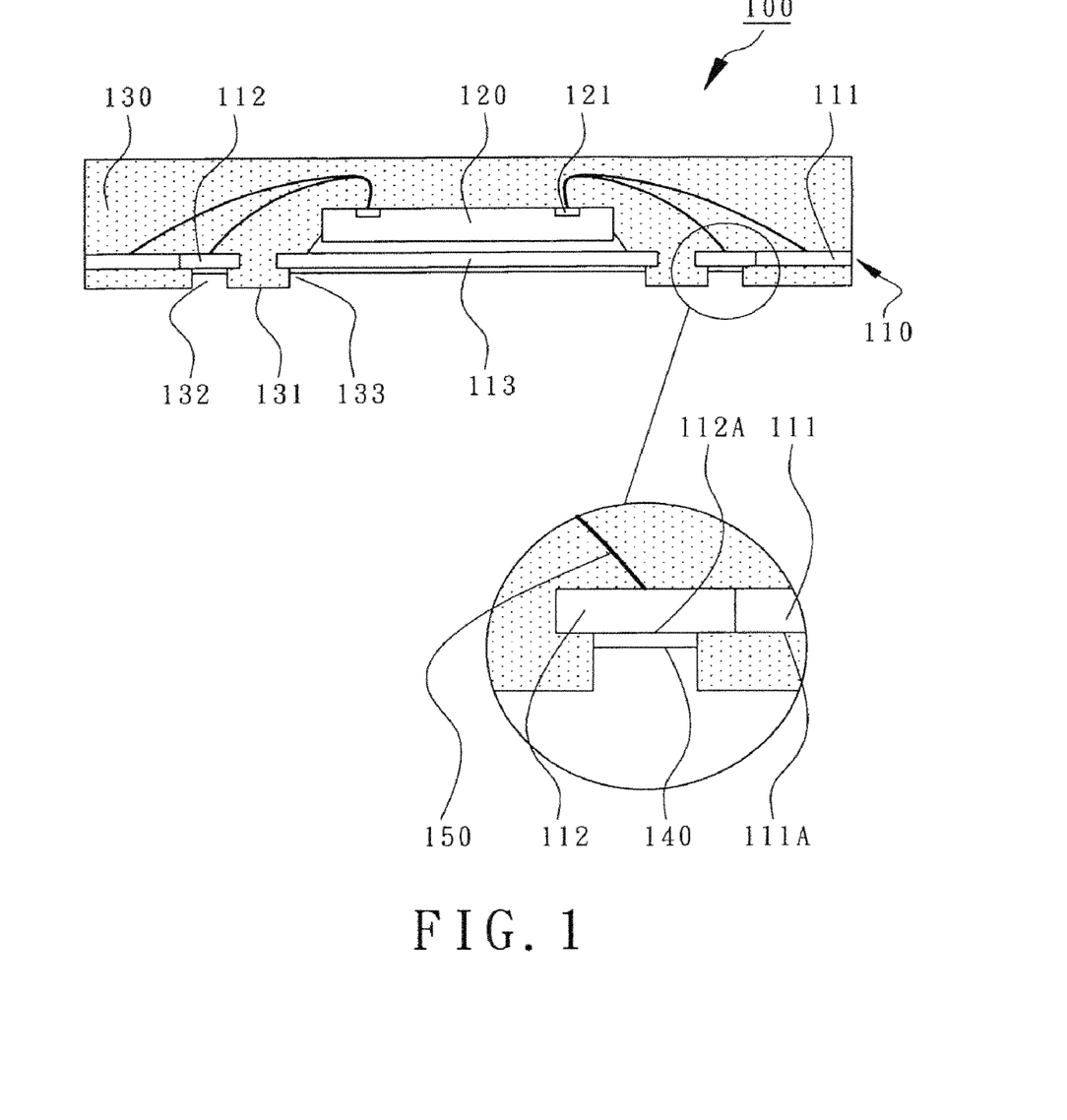
FIG. 1 shows a cross sectional view of a leadless semiconductor package according to the first embodiment of the present invention.
Figure 2:
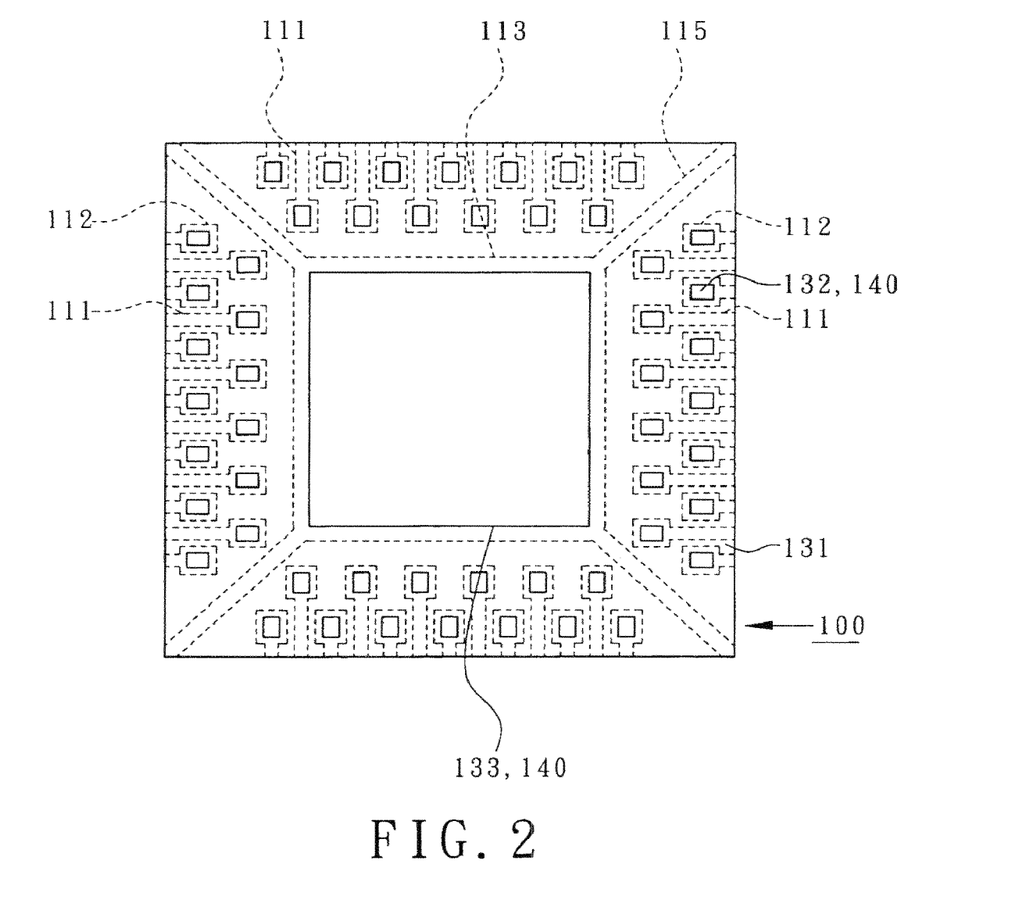
FIG. 2 shows a bottom view of the leadless semiconductor package according to the first embodiment of the present invention.

A leadless semiconductor package with an electroplated layer embedded in the encapsulant is disclosed. As shown in FIGS. 1 and 2, the leadless semiconductor package 100 primarily includes a half-etched leadframe 110, a chip 120, an encapsulant 130, and an electroplated layer 140 where the half-etched leadframe 110 has a plurality of leads 111 and a plurality of outer pads 112 integrally connected to the leads 111. The thickness of the half-etched leadframe 110 ranges between 0.1 mm and 0.5 mm which can be formed by punch or by etching a copper foil where the bottom surfaces of the leads 111 are etched during a first etching step and the bottom surfaces of the outer pads 112 are etched during a second etching step which will be described in detail later. In the present embodiment, the outer pads 112 might be square and their widths are greater than the ones of the leads 111 to increase the outer contact area (as shown in FIG. 2). The half-etched leadframe 110 further has a rectangular die pad 113 for attaching the chip 120 (as shown in FIG. 1). As shown in FIG. 2 again, the lengths of the leads 111 are not necessary equal so that the outer pads 112 can be disposed in multiple-row and staggered arrangements to increase the layout density.

The chip 120 is attached to the half-etched leadframe 110, for example, attaching die-attaching materials to the back surface of the chip 120, then to the die pad 113. But in different embodiments, the chip 120 can be a bare die which is temporarily fixed by a tape during manufacturing processes. Additionally, the chip 120 is electrically connected to the leads 111. A plurality of bonding pads 121 are formed on the active surface of the chip 120. The bonding pads 121 of the chip 120 are electrically connected to the leads 111 of the half-etched leadframe 110 by a plurality of bonding wires 150 or the other electrically connecting components.

The chip 120 and the leads 111 are encapsulated by the encapsulant 130, including the bottom surfaces 111A of the leads 111 are encapsulated. In the present embodiment, the encapsulant 130 is formed on the half-etched leadframe 110 by molding, which is composed of a mixture of thermal setting resins and inorganic ceramic powers. Since the encapsulant 130 is thicker than the chip 120 and the bottom surface 111A of the leads 111 has been pre-etched, therefore, the encapsulant 130 can encapsulate the chip 120 and the leads 111. The encapsulant 130 has a plurality of cavities 132 inwardly formed in a bottom surface of the encapsulant 130. In the present embodiment, the depths of the cavities 132 of the encapsulant 130 are between 0.05 mm and 0.2 mm but not more than the thickness of the half-etched leadframe 110. The cavities 132 reach to the outer pads 112 to partially or fully expose the bottom surface 112A of the outer pads 112. The electroplated layer 140 are formed on the outer pads 112 and are embedded in the cavities 132 where the materials of the electroplated layer 140 may be selected from a group consisting of nickel, gold, tin, tin-nickel-gold, tin-lead, silver, and tin-bismuth to have the functions of anti-corrosion and good soderability. The thickness of the electroplated layer 140 should be less than the depths of the cavities 132.

Therefore, during shipping, handling, or storage, the electroplated layer 140 of the leadless semiconductor package 100 will not be damaged. Furthermore, the top surface, the bottom surface, and the sidewalls of the leads 111 are all encapsulated by the encapsulant 130 to enhance the adhesion between the leads 111 and the encapsulant 130 so that the leads 111 will not be peeled from the encapsulant 130 due to the induced thermal cycles during chip operations.

Preferably, as shown in FIGS. 1 and 2, the diameters of the cavities 132 of the encapsulant 130 are smaller than the ones of the outer pads 112 to define the exposed area of the outer pads. In the present embodiment, the peripheries of the bottom surface 112A of the outer pads 112 are encapsulated by the encapsulant 130 which acts as a solder mask without the conventional solder masks. Accordingly, the outer pads 112 may be called encapsulant-defined pads. The adhesion between the outer pads 112 and the encapsulant 130 can be greatly enhanced. Moreover, the encapsulant 130 further has an opening 133 to partially expose the bottom surface of the die pad 113 to enhance the electroplated layer 140 embedded in the exposed area of the die pad 113.

Figure 3A:
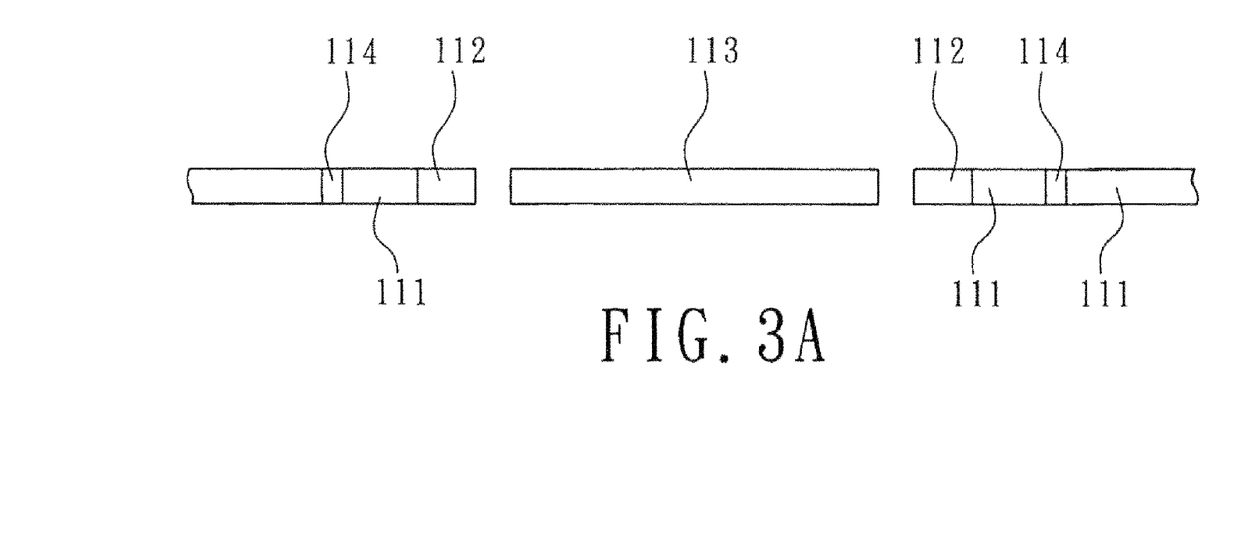
FIG. 3A to 3G shows cross sectional views of the leadless semiconductor package during manufacturing processes according to the first embodiment of the present embodiment.
Figure 3B:
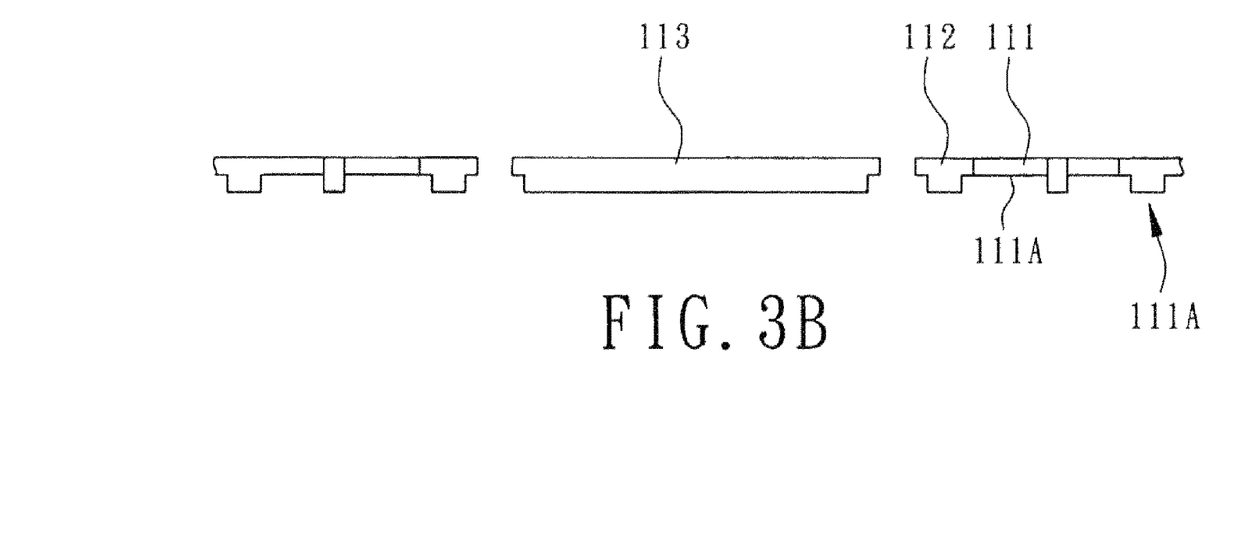
Figure 3C:
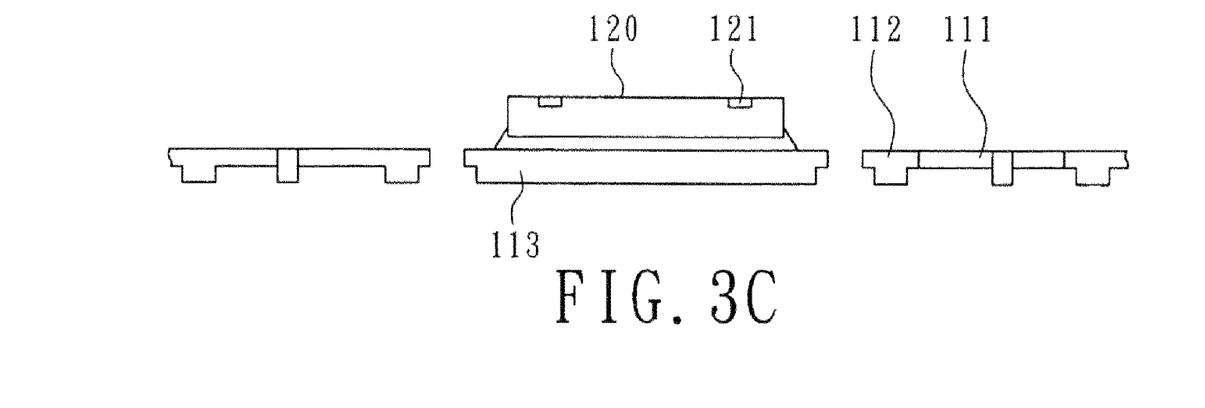
Figure 3D:
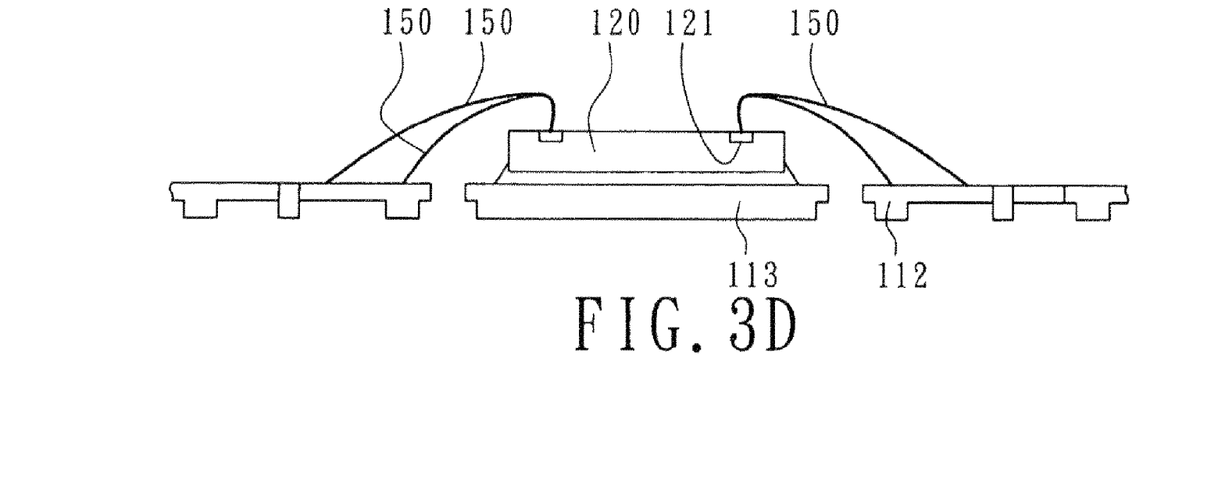
Figure 3E:
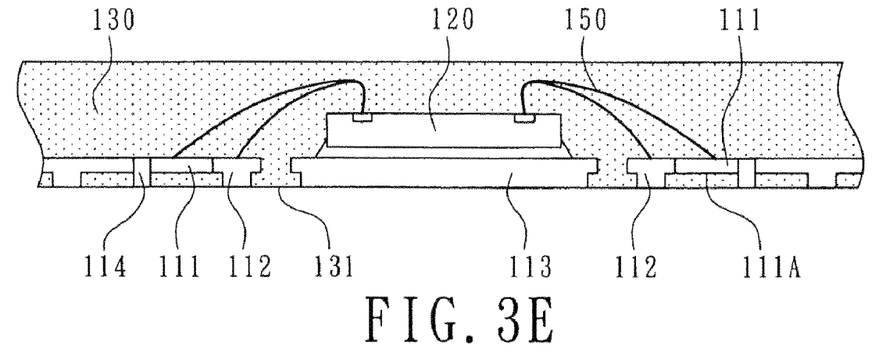
Figure 3F:
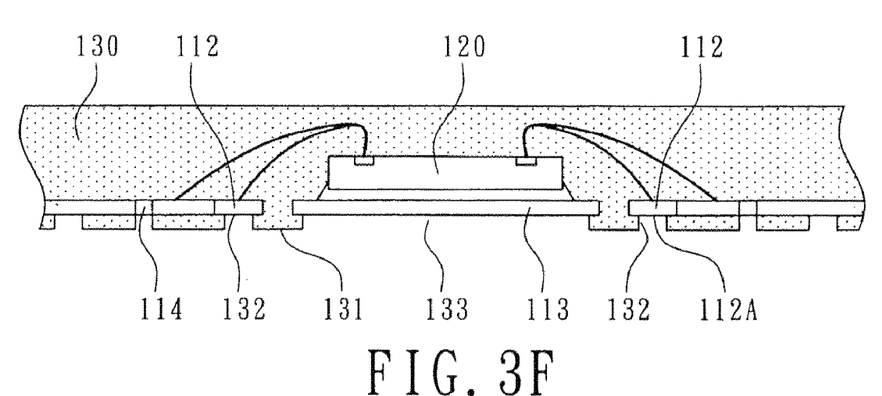
Figure 3G:
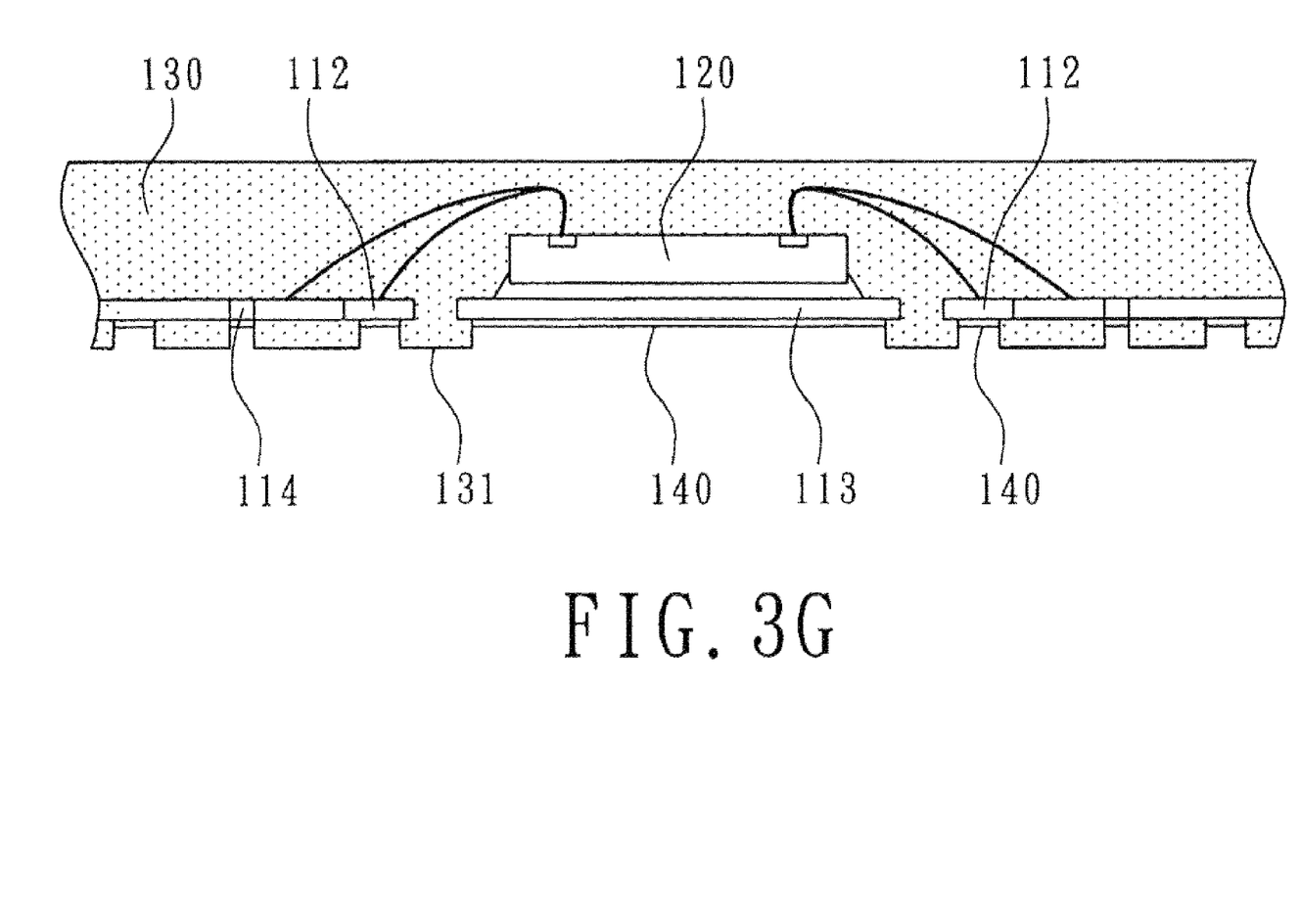
Figure 4:
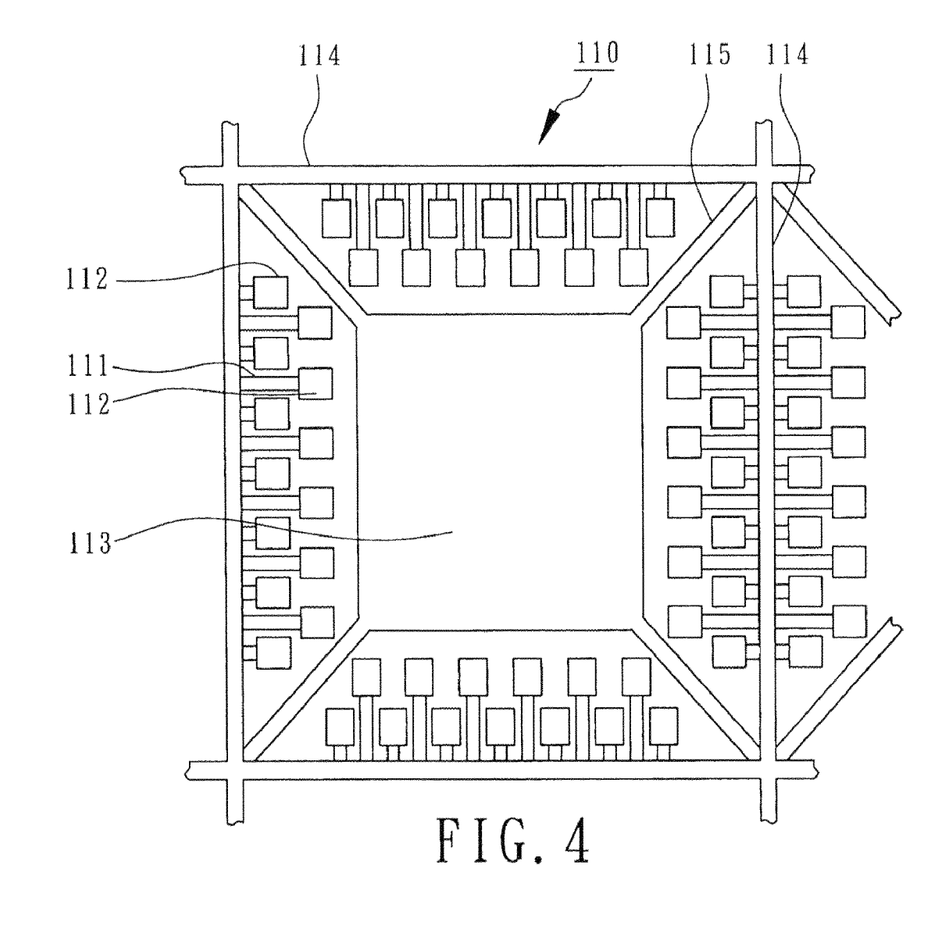
FIG. 4 shows a bottom view of a half-etched leadframe implemented in the leadless semiconductor package according to the first embodiment of the present invention.

The manufacturing processes of the leadless semiconductor packages 100 is revealed from FIG. 3A to 3G, which primarily comprises the steps of "providing a leadframe", "first half-etching", "die attaching", "encapsulating", "second half-etching", "electroplating", and "singulation" in turn. Firstly, as shown in FIGS. 3A and 4, a leadframe is provided which is made by punch or etching. Each packaging unit in the matrix of the leadframe has a plurality of leads 111 and a plurality of outer pads 112 integrally connected to the leads 111 where the leads 111 and the outer pads 112 are not half-etched yet. Then, the first half-etching step is performed, as shown in FIGS. 3B and 4, the bottom surface 111A of the leads 111 is half-etched so that the thickness of the leads 111 becomes thinner than the outer pads 112 where the bottom surface 111A is suspended and raised. The outer pads 112 are still connected to the frame 114, locating at the scribe lines of the leadframe, by the half-etched leads 111. If the leadframe is manufactured by punch, then the manufacturing processes, "providing a leadframe" and "first half-etching", are performed in separated steps. However, if the leadframe is manufactured by etching, then the manufacturing processes, "providing a leadframe" and "first half-etching", are performed simultaneously. Furthermore, the die pad 113 of the leadframe 110 is connected to the frame 114 by a plurality of tie bars 115, as shown in FIG. 4. Preferably, the bottom surfaces of the tie bars 115 are etched simultaneously with the bottom surfaces 111A of the leads 111 during the first half-etching step so that the top surfaces and the bottom surfaces of the tie bars 115 can be also encapsulated by the encapsulant 130.

Then, "die attaching" is performed after "first half-etching". As shown in FIG. 3C, at least a chip 120 is attached to the corresponding die pad 113 and a temporary tape is pre-disposed on the half-etched leadframe 110 (not shown in the figure). Then, as shown in FIG. 3D, the bonding pads 121 of the chip 120 are electrically connected to the leads 111 by a plurality of bonding wires 150.

Then, "encapsulating" is performed. As shown in FIG. 3E, the encapsulant 130 is formed by molding to encapsulate the chip 120 and the leads 111 and to cure the encapsulant 130. In the present processing step, the outer pads 112 and the die pad 113 are exposed and are coplanar with the bottom surface 131 of the encapsulant 130.

After forming the encapsulant 130, "second half-etching" is performed. As shown in FIG. 3F, the bottom surface 112A of the outer pads 112 and the bottom surface of the die pad 113 are half-etched so that the encapsulant 130 has a plurality of cavities 132 reaching to the outer pads 112 and an opening 133 aligned to the die pad 113 respectively. Then, as shown in FIG. 3G, since the outer pads 112 and the die pad 113 are electrically connected to the frame 114 of the half-etched leadframe, the electroplated layer 140 can be formed on the exposed bottom surfaces of the outer pads 112 and the bottom surface of the die pad 113 by electroplating. Moreover, the electroplated layer 140 is embedded in the cavities 132 and in the opening 133. Finally, "singulation" is performed along the cutting lines to remove the frame 114. A plurality of individual leadless semiconductor packages are manufactured as shown in FIG. 1.

Figure 5:
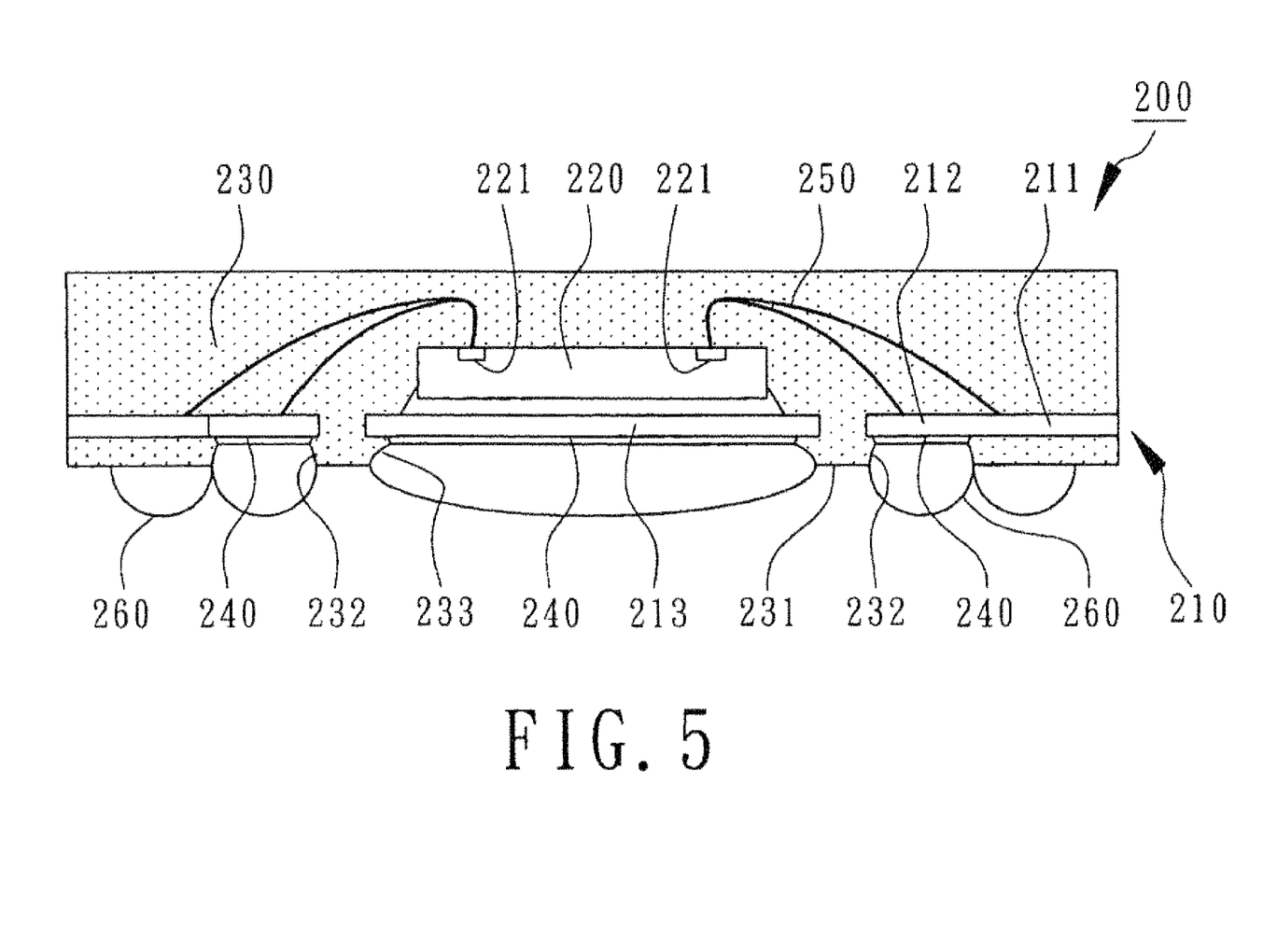
FIG. 5 shows a cross sectional view of another leadless semiconductor package according to the second embodiment of the present invention.
Figure 6:
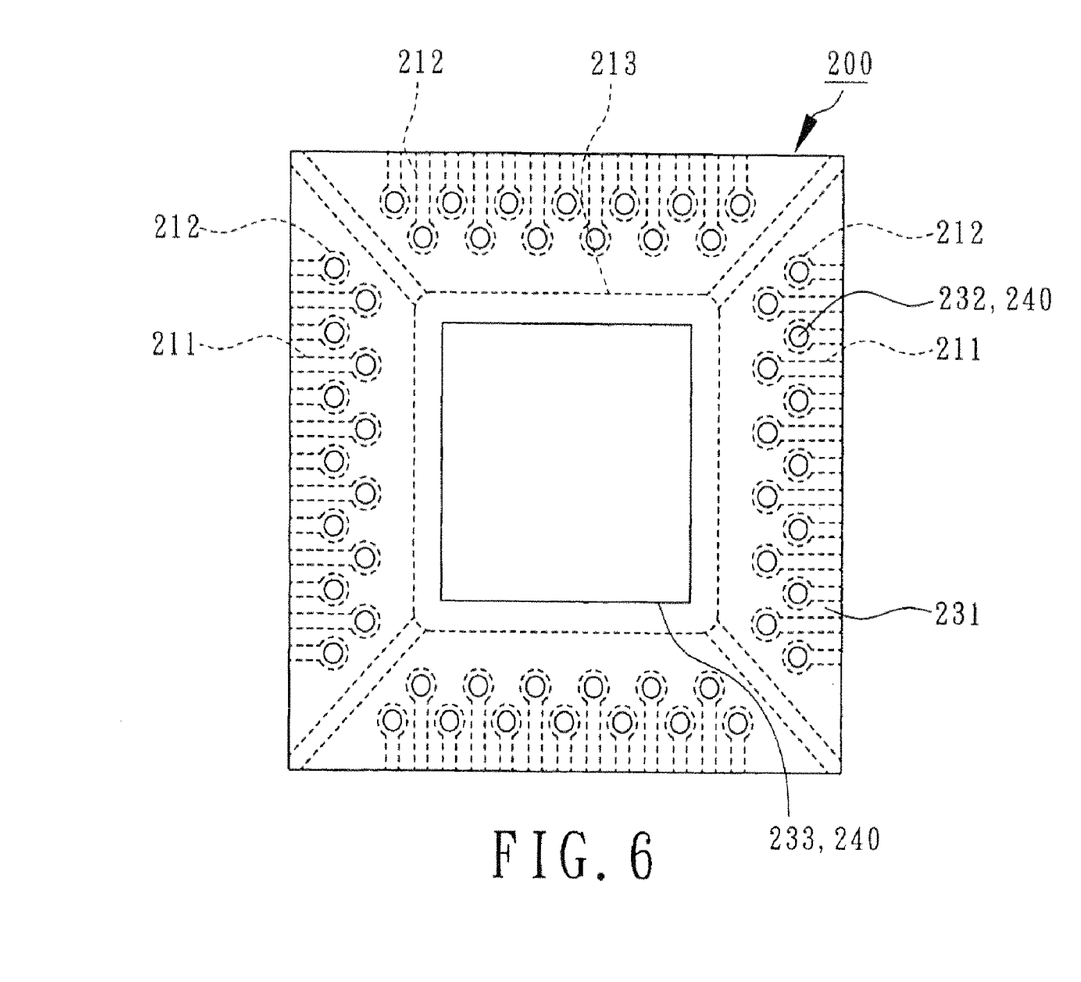
FIG. 6 shows a bottom view of the leadless semiconductor package before solder ball placement according to the second embodiment of the present invention.

Furthermore, the shapes of the outer pads of the half-etched leadframe are not limited where solder balls can be disposed on the outer pads to become a BGA package. In the second embodiment of the present invention, as shown in FIGS. 5 and 6, another leadless semiconductor package 200 includes a half-etched leadframe 210, a chip 220, an encapsulant 230, and an electroplated layer 240 where the half-etched leadframe 210 has a plurality of leads 211 and a plurality of outer pads 212 integrally connected to the leads 211. In the present embodiment, the outer pads 212 are ball pads, which means the outer pads 212 are round and their diameters are larger than the widths of the leads 211. The half-etched leadframe 210 further might have a die pad 213.

The chip 220 is attached to the die pad 213 of the half-etched leadframe 210 and is electrically connected to the leads 211 by a plurality of bonding wires 250. The encapsulant 130 encapsulates the chip 220 and the leads 211 where the bottom surface 231 of the encapsulant 230 has a plurality of cavities 232 reaching to the outer pads 212 and an opening 233 aligned to the die pad 213. The electroplated layer 240 is formed on the outer pads 212 and the die pad 213 and is embedded in the cavities 232 and the opening 233. Then, a plurality of solder balls 260 are bonded to the electroplated layer 240 on the outer pads 212 through the cavities 232. The remaining space of the cavities 232 can be filled by the solder balls 260 to enhance the soldering strength of the solder balls 260.

Figure 7:
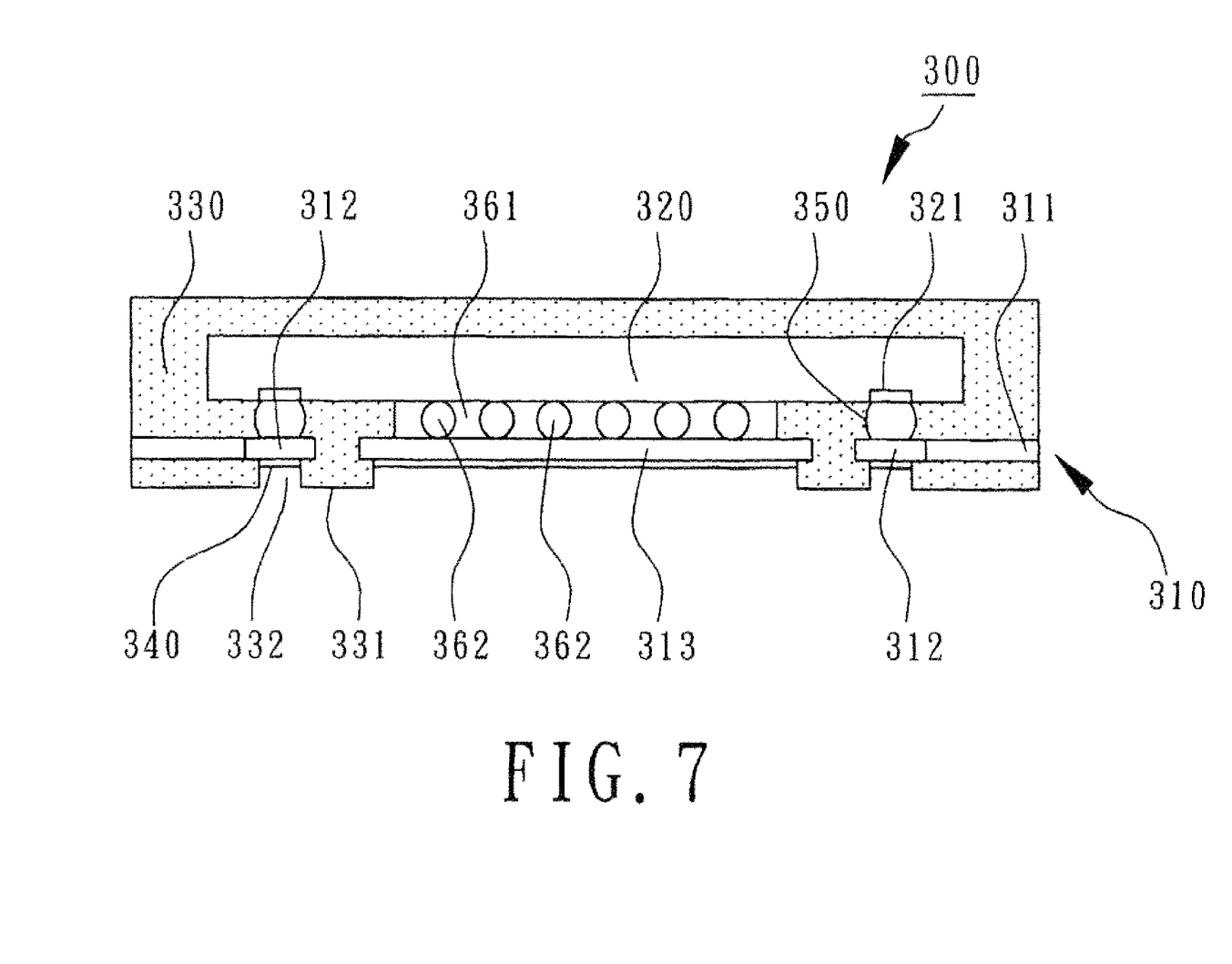
FIG. 7 shows a cross sectional view of another leadless semiconductor package according to the third embodiment of the present invention.

In the third embodiment of the present invention, as shown in FIG. 7, another leadless semiconductor package is disclosed where the leadless semiconductor package 300 is a flip-chip package and primarily includes a half-etched leadframe 310, a chip 320, an encapsulant 330, and an electroplated layer 340. The half-etched leadframe 310 has a plurality of leads 311 and a plurality of outer pads 312 integrally connected to the leads 311. In the present embodiment, the half-etched leadframe 310 further has a die pad 313 to keep the chip 320 in the horizontal position during flip-chip bonding.

The chip 320 is flip-chip attached to the half-etched leadframe 310 and is electrically connected to the leads 311 by a plurality of bumps 350 formed on the bonding pads 321 of the chip 320. In the present embodiment, the chip 320 is attached to the die pad 313 of the half-etched leadframe 310 by a die-attaching film 361 with equal-spacing spacers 362 to fix the chip 320 and to define the reflowing heights of the bumps 350.

The encapsulant 330 encapsulates the chip 320 and the leads 311 where the encapsulant 330 has a plurality of cavities 332 inwardly formed in the bottom surface 331 of the encapsulant 330. The cavities 332 reach to the outer pads 312 to partially or fully expose the bottom surfaces of the outer pads 312. The electroplated layer 340 is formed on the outer pads 312 and is embedded in the cavities 332. Therefore, the electroplated layer 340 of the leadless semiconductor package 300 will not be damaged during shipping, handling, or storage. Furthermore, the top surface, the bottom surface, and the sidewalls of the leads 311 are encapsulated by the encapsulant 330, therefore, the adhesion between the leads 311 and the encapsulant 330 is greatly enhanced to avoid peeling of the leads 311 due to induced thermal cycles during chip operations.

The above description of embodiments of this invention is intended to be illustrative and not limiting. Other embodiments of this invention will be obvious to those skilled in the art in view of the above disclosure.

What is claimed is:

1. A manufacturing process of a leadless semiconductor package, comprising the steps of:
   providing a leadframe having a plurality of leads and a plurality of outer pads integrally connected to the leads;
   performing a first half-etching step to half-etch bottom surfaces of the leads;
   disposing a chip and electrically connecting the chip to the leads;
   forming an encapsulant encapsulating the chip and the leads but exposing the outer pads;
   performing a second half-etching step to half-etch the bottom surfaces of the outer pads so that the encapsulant has a plurality of cavities reaching to the outer pads; and
   forming an electroplated layer on the outer pads embedded in the cavities.

2. The manufacturing process of claim 1, wherein during the first half-etching, the peripheries of the bottom surface of the outer pads are half-etched simultaneously so that the diameters of the cavities formed in the second half-etching are smaller than the ones of the outer pads to define the exposed area of the outer pads.

3. The manufacturing process of claim 1, wherein the half-etched leadframe further has a die pad for attaching the chip.

4. The manufacturing process of claim 3, wherein during the second half-etching, the bottom surface of the die pad are half-etched simultaneously so that the encapsulant further has an opening.

5. The manufacturing process of claim 3, wherein the leadframe further has a plurality tie bars connected to the die pad and during the first half-etching, bottom surfaces of the tie bars are half-etched simultaneously so that the encapsulant completely encapsulates the tie bars.

6. The manufacturing process of claim 1, wherein the depths of the cavities of the encapsulant range between 0.05 mm and 0.2 mm.

7. The manufacturing process of claim 1, wherein the materials of the electroplated layer are selected from a group consisting of nickel-gold, tin, nickel-palladium-gold, tin-lead, silver, tin-bismuth.

8. The manufacturing process of claim 1, further comprising a step of bonding a plurality of solder balls to the outer pads through the cavities.

9. The manufacturing process of claim 8, wherein the outer pads are ball pads.

10. The manufacturing process of claim 1, wherein the lengths of the leads are not equal so that the outer pads can be arranged in multiple-row and staggered.

* * * * *